United States Patent [19]

Wulff

[11] 4,174,676

[45] Nov. 20, 1979

[54] METERING DEVICE FOR A VACUUM DEPOSITION APPARATUS

[75] Inventor: Gunther Wulff, Trübbach, Fed. Rep. of Germany

[73] Assignee: Balzers Patent- und Beteiligungs Aktiengesellschaft, Liechtenstein

[21] Appl. No.: 837,152

[22] Filed: Sep. 28, 1977

[30] Foreign Application Priority Data

Sep. 28, 1976 [CH] Switzerland ............... 012855/76

[51] Int. Cl.² .................. B05C 11/00; C23C 13/12
[52] U.S. Cl. ........................... 118/688; 118/708; 118/722
[58] Field of Search .............. 118/7, 48, 49, 49.1, 118/49.5; 427/248 R, 248 A

[56] References Cited

U.S. PATENT DOCUMENTS

| 2,549,908 | 4/1951 | Johansen | 118/7 X |
| 2,635,579 | 4/1953 | Chadsey, Jr. | 118/49 |
| 3,116,958 | 1/1964 | Blair et al. | 118/49 X |
| 3,446,184 | 5/1969 | Johnson | 118/7 X |
| 4,022,937 | 5/1977 | Bennett et al. | 118/7 X |

FOREIGN PATENT DOCUMENTS 614045  2/1961  Canada ........................ 118/7

Primary Examiner—Wm. Carter Reynolds
Attorney, Agent, or Firm—McGlew and Tuttle

[57] ABSTRACT

A device for feeding materials to an evaporator of a vapor deposition apparatus comprises a balance onto which material to be evaporated is fed and an ejector associated with the balance and responsive to a predetermined weight of the substance on the balance to eject the substance from the balance through a trajectory path and into the evaporator.

6 Claims, 2 Drawing Figures

METERING DEVICE FOR A VACUUM DEPOSITION APPARATUS

BACKGROUND OF THE INVENTION

1. Field of the Invention

The present invention relates, in general, to devices for the vapor deposition of substances and, in particular, to a new and useful metering device for vacuum deposition apparatus, by which the substance to be evaporated can be fed to the evaporator in portions.

2. Description of the Prior Art

Metering devices are employed in vapor deposition apparatus, for example, for the so-called flash deposition, if, for some reasons, the otherwise usual evaporation from a melt is not advantageous, as in case of vaporizing mixtures of several components having very different vapor pressures, so that the more volatile components evaporate first and a condensate layer is obtained which is inhomogeneous in the direction perpendicular to the plane of the layer. Such devices are further used for supplying the substance in crucible evaporation processes.

It is well known to feed the substance to be evaporated to the evaporator surface in an amount corresponding to the desired thickness of the deposited layer, in which case the respective portion is completely evaporated.

A known wire feed device permits a very accurate metering, however, it has the disadvantage that it can be used only for evaporation of substances which can take the form of a uniform thick and deformable wire. Therefore, this method is limited to specific metals and alloys.

The so-called spiral or helical conveyors, which also are frequently employed in vapor deposition apparatus, permit a continuous supply of granular material, but the graduation according to grain size which occurs is to be taken into account. Further, in spite of keeping the operating voltage constant, the supply velocity in spiral conveyors strongly depends on the level and, consequently, the supply rate cannot be controlled by means of the operating voltage. In addition, in spiral conveyors having a small outlet, there is a risk that the outlet will be blocked by vapor condensates if located close to the evaporator. To avoid this, the material to be evaporated egressing from the spiral conveyor may be directed to the evaporation surface over an inclined trough, which, however, has still the disadvantage that, as an obstacle, it causes a shadow in the vapor stream with the possible result of a non-uniform coating, aside from the fact that the trough also may be blocked by condensates.

SUMMARY OF THE INVENTION

The present invention is directed to a metering device in vacuum deposition apparatus, for feeding the substance to be evaporated to the evaporator in portions, which is designed for being located completely outside the useful vapor cone needed for the vapor deposition, without having to provide a shadow casting connection to the evaporation surface or evaporation crucible.

In accordance with the invention, the metering device comprises a balance with an associated ejector, comprising a control mechanism operating in a manner such that upon attaining a predetermined desired weight on the balance of the measured portion of substance to be evaporated, this portion is transported, by means of the ejector, along a trajectory and into the evaporator.

With the invention, unlike the prior art, no constructional parts of a feed device are provided which protrude into the useful vapor cone extending from the evaporator to the substrates to be coated (cup-shaped support of the substrates). The invention also offers another advantage in that the entire metering device may be located in the evaporation chamber even below the level of the evaporation surface, and thus protected against any vapor deposition which is still possible in cases where such a device is placed only laterally of the useful vapor cone, even if outside the same. This increases the reliability in operation and life of the device.

Accordingly, it is an object of the invention to provide a device for feeding materials to an evaporator of a vapor deposition apparatus which comprises a balance with means for feeding a substance to be evaporated to the balance and ejector means associated with the balance and responsive to a predetermined weight of the substance thereon to eject the substance from the balance and move it through a trajectory path to be evaporated.

A further object of the invention is to provide a device for feeding materials to an evaporator which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there are illustrated preferred embodiments of the invention.

GENERAL DESCRIPTION OF THE PREFERRED EMBODIMENTS

Figure 1:
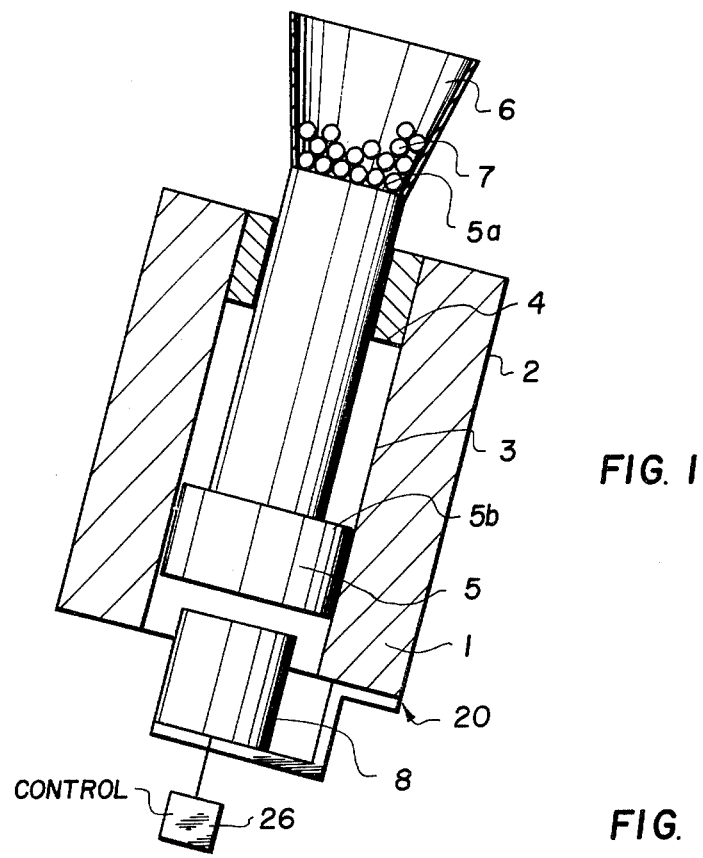
FIG. 1 is an enlarged diagrammatic sectional view of a balance having an ejector for ejecting weighed quantities of substances through a path into an evaporator and constructed in accordance with the invention.

Referring to the drawings, in particular, the invention embodied therein comprises a metering or feeding device generally designated 20 which provides means for delivering or feeding the measured weight of a substance or material to be evaporated 7 into an evaporator 17 of an electron-beam heater evaporator 12 which, in the embodiment shown, includes an electron beam evaporator hot cathode portion 24.

Figure 2:
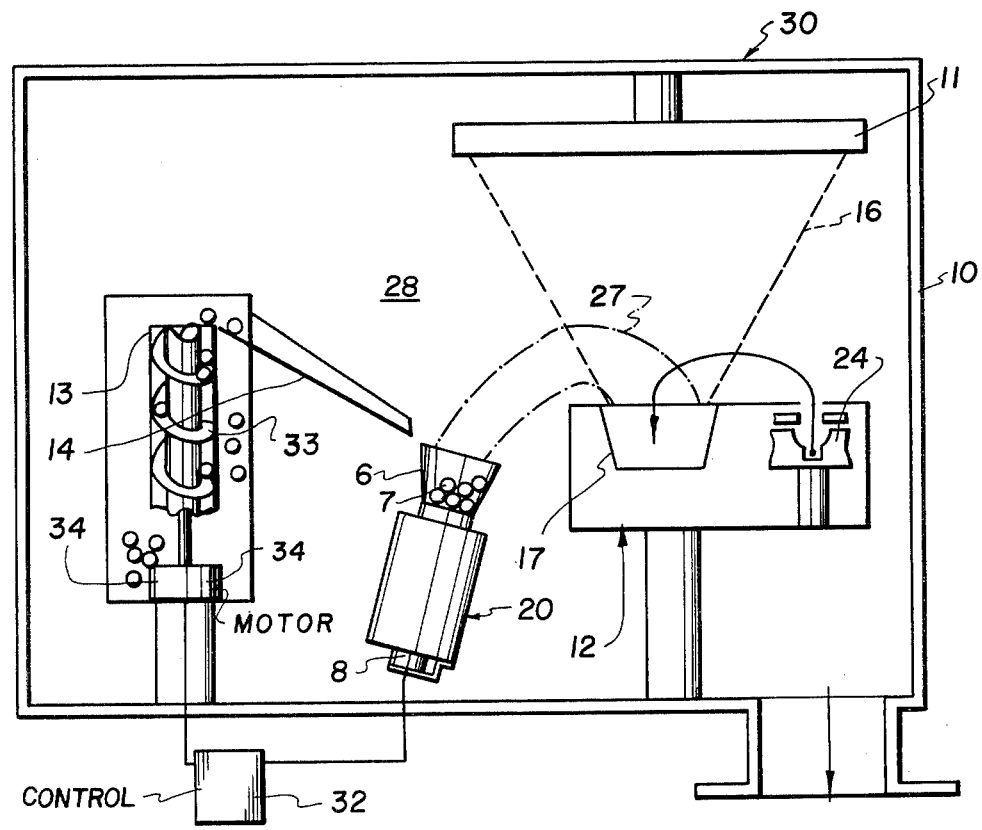
FIG. 2 is a diagrammatical sectional view of a vapor deposition device having a metering device associated therewith constructed in accordance with the invention.

In accordance with the invention, the metering device 20 comprises a housing having an outer wall 2 and an inner wall 3 for accommodating a coil 1 of an electro-magnet having an armature 5 which is movable along the axis of the coil and which forms a portion of balance means including a receptacle or trough 6 with a surface 5a onto which the material 7 to be evaporated is directed. The receptacle 6 has an open top into which the material is initially fed from a supply device 13 as shown in FIG. 2. A stop 4 for the movable armature 5 is located along its path of movement and a widened portion 5b abuts against it in the end position in which the armature attains when it is in the process of ejecting the substance 7 outwardly through a trajectory path 27 into the evaporator 17, as shown in FIG. 2. The armature 5 is made of a magnetizable material and is advantageously constructed with the cup 6 for the substance 7 to be evaporated. Weighing means are associated with the armature for weighing the substance 7 when it is deposited in the cup 6 and such weighing means advantageously comprise an electrical control system including a control 26 and switch means 8 advantageously comprising a proximity switch associated with the armature 5 and the coil 1.

In a preferred embodiment, the proximity switch comprises a distance sensor 8. The magnetic coil 1 is capable, upon energizing the coil with a definite current of abruptly accelerating the armature in an upward direction to an extent such that the portion of the material to be evaporated 7, which is present in the cup 6, is ejected from the cup and thrown along a free trajectory 27 and into the crucible 17 of the evaporator 12. For this purpose, it is essential that the metering device 20 and the evaporator crucible 17 be located in an evaporation chamber 28 and in an appropriate relationship to each other.

The relationship of the parts are shown in FIG. 2 wherein an evaporation device housing 30 which may be evacuated includes a wall 10 carrying a simple supporting structure 11 for the substrates to be coated. Either an electron beam evaporator or an ordinary thermal evaporator 12 are located below the support structure 11. The material to be evaporated is fed from a container or hopper 13, for example, by feed means which may comprise a screw conveyor 33 into a supply trough 14 so that the material is deposited on the balance means in the form of the armature 5 and its associated coil 1. FIG. 2 also indicates the location of a vapor cone 16 which is formed above the crucible 17 of the evaporator 12.

The device operates as follows:

The signal delivered by the proximity switch is usually one operating at some 100 up to 1000 $H_Z$ and it is used in a control unit for continuously and automatically adjusting the energizing current of the coil in a manner such that during the entire charging operation, armature 5 remains spaced from proximity switch 8 by a definite and constant distance. The coil current necessary for this purpose is approximately proportional to the weight of the armature, including receptacle 6, plus the weight of the amount of substance to be evaporated just received in the cup. Thus, this system operates as a balance in which the coil current, which increases with the increasing filling with the substance to be evaporated of the cup, is a measure of the weight. As soon as the current attains a definite value corresponding to a predetermined desired weight of the portion present on the balance, a current pulse of preselected strength is applied to the magnet coil by means of the control unit 32 which pulse is strong enough to cause an ejection from the receptacle 6 of the substance portion received therein, and at a speed that, in the shown embodiment, the substance is thrown along a ballistic trajectory into the evaporation crucible. As soon as the receptacle 6 is emptied, the current is controlled by the control unit 32 in a manner such that armature 5 returns into its provided initial position in which it is spaced from the proximity switch at a definite distance, and the weighing operation may recommence.

The total amount of the substance to be evaporated fed to the evaporator is thus determined by the desired weight and the number of portions i.e. the number of current pulses necessary for releasing a throwing operation. This number of pulses may also by used for controlling the speed of feed of the supply device 13 e.g. by operating motor 34 for conveying the substance to be evaporated to the metering device, in a manner such that only the required amount is supplied during each cycle.

In the following embodiment, current is applied to the magnetic coil 1 at an initial value similar to the previous embodiments to permit armature 5 to drop to an initial position at a location spaced above switch means 8.

The switch means 8 used for the disclosed weighing device as an alternate embodiment may be designed, in a manner known per se, as an inductive or capacitative distance meter delivering an electrical-signal which is proportional to the positon of the armature 5. This is particularly advantageous for an electronic integration of the individual amounts, for determining the total amount of the supplied substance to be evaporated, particularly if the substance comprises larger grains or even lumps and, consequently, the weight of the individual portions cannot be appropriately predetermined.

With smaller requirements on accuracy, the design of the weighing device may, of course, be simpler, for example, instead of an electronic proximity switch, the switch means 8 may comprise a simple contact switch and a spring and the spring may be dimensioned for being compressed by the desired weight of the cup filling just as far as to actuate the switch and, thereby, releasing a current pulse for ejecting the contents of the cup.

In this case again, the number of the cup fillings or charges is a measure for the total evaporated amount, even if the weight of the individual portions and, thereby, of the total amount, is less accurately determined.

While specific embodiments of the invention have been shown and described in detail to illustrate the application of the principles of the invention, it will be understood that the invention may be embodied otherwise without departing from such principles.

What is claimed is:

1. A vapor deposition device comprising a housing defining an evacuation chamber, a heater evaporator in said housing chamber, a support for a substrate to be coated located above said heater evaporator, a feeding device for material to be evaporated located alongside said heater evaporator comprising an electromagnet including a coil, an armature associated with said coil and being movable upwardly and downwardly, a receiving trough defined on said armature with an open top for receiving the material to be evaporated therein, and control means connected to said coil for energizing said coil so that upon accumulation of a predetermined weight of material on said trough, said coil is activated to move said armature rapidly to cause ejection of the material accumulated thereon through a trajectory path upwardly and into said evaporator.

2. A metering device, according to claim 1, wherein said ejector means are located below the evaporator.

3. A metering device, according to claim 1, wherein said balance comprises an armature, an electromagnet carrying said armature and having an energized coil set to locate the armature in a position which varies in accordance with the amount of substance on the armature 4. A device according to claim 1, wherein said evaporator includes an open top crucible.

5. A device according to claim 1, including means for feeding the substance to be evaporated into the open top of said receiving trough on said armature, said control means including means for controlling the speed of feed of material into said receiving trough as well as for controlling the energization of the coil of said armature.

6. A metering device for supplying material to be evaporated to a vacuum deposition apparatus which has an evaporator disposed adjacent an article to be coated, comprising a balance, means for feeding the material to be evaporated onto said balance, ejector means for applying an upward force from below to the material for directing the material on said balance through a trajectory path to the evaporator, and control means connected to said ejector means and said balance for actuating said ejector means so that upon attaining a predetermined desired weight on the balance of the material to be evaporated, the material is directed by said ejector means through a trajectory into the evaporator, said ejector means including a movable armature for applying the upward force to the material having a receptacle with an opening for receiving the material and for ejecting it through the trajectory path.

* * * * *